(12) United States Patent  
Lim et al.

(10) Patent No.: US 7,161,970 B2  
(45) Date of Patent: Jan. 9, 2007

(54) SPREAD SPECTRUM CLOCK GENERATOR

(75) Inventors: Hong Sair Lim, Singapore (SG); Junho Cho, Markham (CA)

(73) Assignee: FTD Solutions Pte, Ltd., Singapore (SG)

( * ) Notice: Subject to any disclaimer, the term of this patent is extended or adjusted under 35 U.S.C. 154(b) by 0 days.

(21) Appl. No.: 10/939,199

(22) Filed: Sep. 10, 2004

(65) Prior Publication Data

US 2006/0056491 A1    Mar. 16, 2006

(51) Int. Cl.  
*H04B 1/69*    (2006.01)

(52) U.S. Cl. ...................... 375/130; 375/376

(58) Field of Classification Search ........... 375/130, 375/377, 376, 373, 375, 215, 327; 331/57, 331/78; 327/147, 156  
See application file for complete search history.

(56) References Cited

U.S. PATENT DOCUMENTS

| | | | | |
|---|---|---|---|---|
| 5,488,627 | A | 1/1996 | Hardin et al. | 375/204 |
| 5,631,920 | A | 5/1997 | Hardin | 375/200 |
| 5,651,037 | A * | 7/1997 | Barrett et al. | 375/377 |
| 5,867,524 | A | 2/1999 | Booth et al. | 375/200 |
| 5,872,807 | A | 2/1999 | Booth et al. | 375/200 |
| 6,167,103 | A | 12/2000 | Hardin | 375/376 |
| 6,215,364 | B1 * | 4/2001 | Hwang et al. | 331/57 |
| 6,292,507 | B1 | 9/2001 | Hardin et al. | 375/130 |
| 6,366,174 | B1 | 4/2002 | Berry et al. | 331/78 |
| 6,404,834 | B1 | 6/2002 | Hardin et al. | 375/376 |
| 6,545,657 | B1 * | 4/2003 | Aoki | 345/94 |
| 6,559,698 | B1 | 5/2003 | Miyabe | 327/157 |
| 6,597,226 | B1 | 7/2003 | Eade et al. | 327/292 |
| 6,647,052 | B1 | 11/2003 | Hailey | 375/130 |
| 6,667,640 | B1 * | 12/2003 | Asano | 327/147 |
| 6,703,902 | B1 * | 3/2004 | Jeon et al. | 331/17 |

OTHER PUBLICATIONS

"Dual-Loop Spread-Spectrum Clock Generator," by Hung-Sung Li et al. IEEE Int. Solid State Cir. Conf. Dig. Tech. Papers, 1999, pp. 184-185.

"A Spread-Spectrum Clock Generator With Triangular Modulation", by Hsiang-Hui Chang et al., IEEE Jrnl. of Solid-State Cir., vol. 38, No. 4, Apr. 2003, pp. 673-676.

"Spread-Spectrum Clocking in Switching Regulators for EMI Reduction", by Takayuki Daimon et al., IEICE Trans. Fundamentals, vol. E86-A, No. 2, Feb. 2003, pp. 1959-1966.

"Clock Dithering for Electromagnetic Compliance Using Spread Spectrum Phase Modulation", by Yongsam Moon et al., IEEE Int. Solid-State Cir. Conf. Dig. Tech. Papers, 1999, pp. 186-187.

(Continued)

*Primary Examiner*—Dac Ha  
*Assistant Examiner*—Jaison Joseph  
(74) *Attorney, Agent, or Firm*—Saile Ackerman LLC; Stephen B. Ackerman

(57) ABSTRACT

A spread spectrum clock generator comprises a conventional closed-loop VCO and an open-loop VCO where both are coupled to the same point of the PLL. Both VCOs comprise a V-to-I converter followed by a current-controlled oscillator and are identical in design but only the open-loop VCO receives the modulation current to generate the spread spectrum clock signal. The open-loop ICO is part of the spread spectrum generator and in one embodiment of the invention receives feedback current signals representing the modulation method and modulation ratio. This ensures that the modulated clock output tracks the PLL output frequency. In a second embodiment the closed-loop VCO receives from the spread spectrum generator the feedback current signal representing the modulation method (center/down spread) while the open-loop VCO receives the feedback signal representing the modulation ratio.

40 Claims, 5 Drawing Sheets

OTHER PUBLICATIONS

"An Architecture of High-Performance Frequency and Phase Synthesis," by Hugh Mair et al., IEEE Jrnl. of Solid-State Circuits, vol. 35, No. 6, Jun. 2000.

"A Spread Spectrum Clock Generator for EMI Reduction," by Hung-Wei Chen et al., IEICE Trans. Electron, vol. E8-C, No. 12, Dec. 2001, pp. 1959-1966.

"A Frequency Modulated PLL for EMI Reduction in Embedded Application", by J-Y Michel et al., Proc. IEEE Int. ASIC/Soc Conf., 1999, pp. 362-365.

"1.5 Gbps, 5150 ppm Spread Spectrum SerDes PHY with a 0.3 mW, 1.5 Gbps Level Detector for Serial ATA," by Mitsutoshi Sugawara et al. Symp. VLSI Cir. Dig. Tech. Pap., pp. 60-63, Jun. 2002.

* cited by examiner

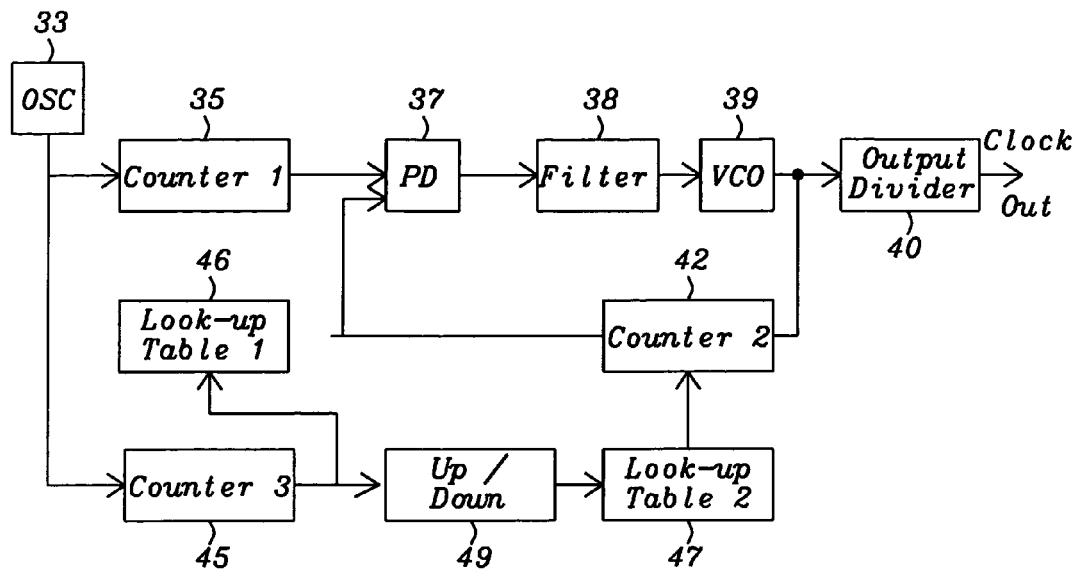
FIG. 1 — Prior Art
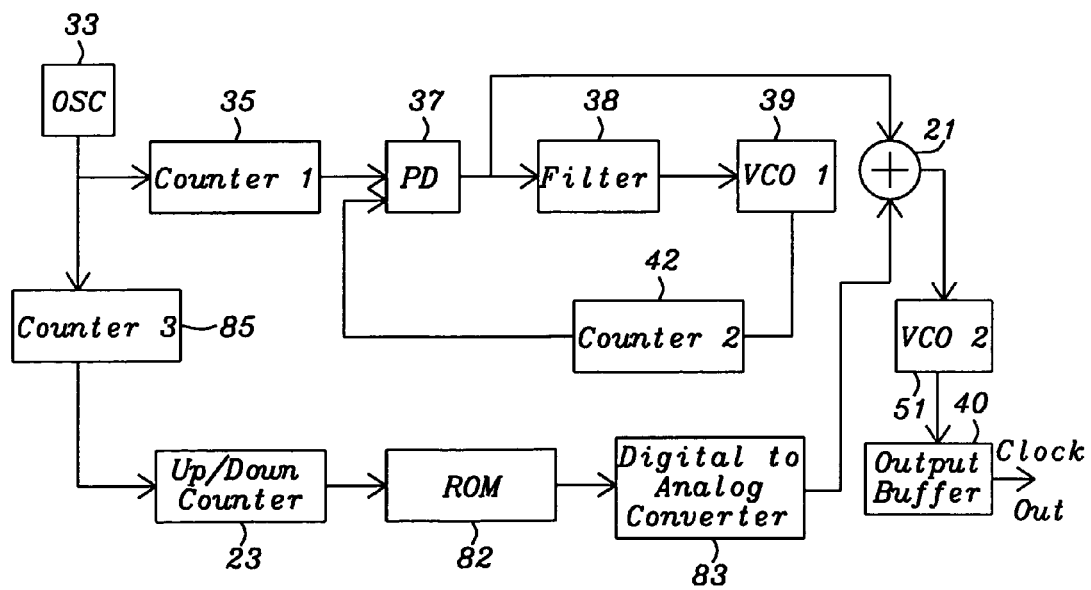
FIG. 2 — Prior Art

SPREAD SPECTRUM CLOCK GENERATOR

BACKGROUND OF THE INVENTION

1. Field of the Invention

The invention relates to reducing electromagnetic interference (EMI) of clock generating circuits, and more particularly to architectures for digital spread spectrum modulators with frequency and profile modulation.

2. Description of the Related Art

FIG. 1 is a simplified block diagram of the related art U.S. Pat. No. 5,488,627 (Hardin et al.) FIG. 6, which is a conventional type phase-locked loop (PLL) which modulates the divider. Oscillator (OSC) 33 feeds Counter 1 block 35 which feeds Phase Detector (PD) 37 followed by Filter 38 and Voltage-Controlled Oscillator (VCO) 39. Block 39 is coupled to an Output Divider 40 (with output Clock Out) and Counter 2 block 42. Counter 2 block 42 in turn is coupled back to block 37. Blocks 35, 37, 38, 39, and 42 make up the PLL. Oscillator 33 also feeds Counter 3 block 45. Coupled in series between the output of Counter 3 block 45 and a second input to Counter 2 block 42 are Up/Down 49 and Look-up Table 2 block 47. Look-up Table 1 block 46 is coupled between blocks 45 and 35 and provides a second input to block 35.

The architecture of U.S. Pat. No. 5,488,627 (Hardin et al.) FIG. 6 has the technical implementation difficulty of a conventional type PLL modulating the divider that a very large input reference divider (Counter 1) and feedback divider (Counter 2) is required in order to implement the N-step "Hershey Kiss" or Step triangular profile. This results in the reference input frequency to the phase frequency detector to be very small and thus a very low loop bandwidth is required for stability. However, a very low loop bandwidth means a very large and external loop filter capacitor is required; also the PLL will be too slow to track the modulation signal. One solution to this is to use a Fractional-N PLL, but this approach also has technical implementation problems which results in having to overcome a high circuit complexity.

FIG. 2 is a simplified block diagram of the related art U.S. Pat. No. 5,488,627 (Hardin et al.) FIG. 9, which sums the loop filter output voltage with a DAC output voltage, where the DAC gets its profile from a ROM. The PLL of FIG. 2 is like the PLL of FIG. 1 except that Filter 38 also feeds a Summing Node 21 and that there is no second input to block 35. Coupled in series between Counter 3 block 85 and Summing Node 21 are Up/Down Counter 23, ROM 82, and Digital-to-Analog Converter 83. The output of Summing Node 21 goes to VCO 51 and from there to Output Buffer 40 and output Clock Out.

Regarding the summing loop filter voltage, the technical implementation problem is having to add the loop filter output voltage with a very small voltage which can be as small as 1% of the loop filter output voltage. For example, a practical value of the loop filter output voltage is 1V, to sum this 1V with 10 mV (1%) requires a low offset opamp. But since this 10 mV signal contains $2^N$ steps to implement the "Hershey Kiss" modulation, Step triangular, or any other modulation profiles, this adder becomes impossible to design to such a degree of accuracy.

Since the spread spectrum clock generator designs as discussed above have various implementation problems, a new approach is highly desirable and is presented hereby in this invention.

There are three types of spread spectrum clock generators (SSCGs) in the literature. The first type modulates the voltage-controlled oscillator (VCO) directly; refer to:

H. S. Li, Y. C. Cheng, and D. Puar, "*Dual-Loop Spread Spectrum Clock Generator*," in IEEE Int. Solid State Circuits Conference Dig. Tech. Papers, 1999, pp. 184-185; and H. H. Chang, I. Hua, and S. Liu, "*A Spread Spectrum Clock Generator With Triangular Modulation*," IEEE Journal of Solid-State Circuits, Vol. 38, No. 4, April 2003, pp 673-676.

The second type combines the multiphase outputs of the clock source and the special digital processing circuits to achieve the spread spectrum function; refer to:

Y. Moon, D. K. Jeong. and G. Kim, "*Clock Dithering for Electromagnetic Compliance Using Spread Spectrum Phase Modulation*," in IEEE Int. Solid State Circuits Conference Dig. Tech. Papers, 1999, pp. 186–187;

H. Mair and L. Xiu, "*An Architecture of High-Performance Frequency and Phase Synthesis*," IEEE Journal of Solid-State Circuits, Vol. 35, No. 6, June 2000; and H. W. Chen and J. C. Wu, "*A Spread Spectrum Clock Generator for EMI Reduction*," IEICE Trans. Electron., Vol. E84-C, No. 12 December 2001.

The third type modulates the divider in a phase-locked loop (PPL); refer to:

J. Y. Michel and C. Neron, "*A Frequency Modulated PLL for EMI Reduction in Embedded Application*," in Proc IEEE Int. ASIC/SOC Conf., 1999, pp 362-365; and M. Sugawara et al., "1.5 *Gb/s* 5150-*ppm Spread Spectrum SerDes PHY with a* 0.3 *mW* 1.5 *Gb/s Level Detector for Serial ATA*," in Symp. VLSI Circuits Dig. Tech Papers, June 2002, pp 60-63.

This type of architecture is also shown in U.S. Pat. No. 5,488,627 (Hardin et al.) FIG. 6. The same U.S. patent shows in FIG. 9 an architecture which modulates the loop filter output voltage. See reference to U.S. patents below.

Other U.S. patents which bear on the present invention are:

U.S. Pat. No. 5,488,627 (Hardin et al.) describes a clock circuit which includes an oscillator for generating a reference frequency signal, and a spread spectrum clock generator. The spread spectrum clock generator works with the oscillator to generate a spread spectrum clock output signal having a fundamental frequency and reduced amplitude electromagnetic interference, EMI, spectral components at harmonics of the fundamental frequency.

U.S. Pat. No. 5,631,920 (Hardin) is related to and an enhancement to U.S. Pat. No. 5,488,627 described above. It also describes a clock circuit which includes an oscillator for generating a reference frequency signal, and a spread spectrum clock generator. The spread spectrum clock generator works with the oscillator to generate a spread spectrum clock output signal having a fundamental frequency and reduced amplitude electromagnetic interference, EMI, spectral components at harmonics of the fundamental frequency.

U.S. Pat. No. 5,867,524 (Booth et al.).) is related to and a refinement of U.S. Pat. No. 5,488,627 described above.

U.S. Pat. No. 5,872,807 (Booth et al.) is related to, and an enhancement to U.S. Pat. No. 5,488,627 described above. It also describes a clock circuit which includes an oscillator for generating a reference frequency signal, and a spread spectrum clock generator. The spread spectrum clock generator works with the oscillator to generate a spread spectrum clock output signal having a fundamental frequency and reduced amplitude electromagnetic interference, EMI, spectral components at harmonics of the fundamental frequency.

U.S. Pat. No. 6,167,103 (Hardin) is similar to U.S. Pat. Nos. 5,488,627 and 5,631,920 but uses RAMs instead of ROMs for widely differing applications.

U.S. Pat. No. 6,292,507 B1 (Hardin et al.) describes an improved spread spectrum clock generator circuit which automatically compensates for variations in passive component values and system gain and charge pump current in a Phase Locked Loop circuit.

U.S. Pat. No. 6,366,174 B1 (Berry et al.) describes an improved clock generation circuit which operates with a single input clock frequency, and includes a Phase Locked Loop circuit (PLL) with a digital accumulator in the feedback loop, in which either the most significant bit or the carry bit of the binary adder is used as the modulated feedback clock to the phase/frequency detector of the PLL.

U.S. Pat. No. 6,404,834 (Hardin et al.)) discloses a segmented spectrum clock generator which exhibits a frequency response having multiple segments. The segmented spectrum clock generator output signal is generated by a frequency synthesizer circuit which modulates the output frequency at a predetermined rate between upper and lower bounds.

U.S. Pat. No. 6,559,698 (Miyabe) describes a second order PLL having a loop filter including a first capacitor and a first resistor. In this circuit, a reduction in a comparison frequency is avoided by using a clock modulating circuit to restrain cycle-to-cycle jitter in a clock generator subjected to EMI.

U.S. Pat. No. 6,597,226 (Eade et al.) describes an ASIC architecture that uses a Spread Spectrum Clock Generator, SSCG module and that uses both a frequency modulated clock signal and a pure clock signal, where both clock signals are synchronized and where the ASIC architecture minimizes the number of pins and silicon area needed to provide the dual clock signals.

U.S. Pat. No. 6,647,052 (Hailey) describes a method and an apparatus for reducing EMI emission in a multi source electronic system. The phase of the modulated waveform is varied to minimize the number of clocks within the EMI measurement bandwidth. The phase of the modulated waveform is varied in proportion to the number of EMI generating sources in the electronic system.

It should be noted that none of the above-cited examples of the related art offers the advantages of a voltage-controlled oscillator comprising a V-to-I converter coupled to a current-controlled oscillator, thereby eliminating the need of providing a very precise op amp for summing voltages.

SUMMARY OF THE INVENTION

It is an object of at least one embodiment of the present invention to provide a more robust architecture for a spread spectrum clock generator by using current instead of voltage in the voltage-controlled oscillators. The architecture is thus less susceptible to noise than in the voltage mode, eliminating thereby the need of the prior art for a very precise op amp for voltage summing.

It is another object of the present invention to provide an architecture which can easily generate a spread spectrum ratio which tracks the voltage-controlled oscillator output frequency without adding data in memory.

It is yet another object of the present invention to provide an architecture which can easily generate spread methods, such as center and down spreads, without adding data in memory.

It is still another object of the present invention to provide an architecture which can easily implement various spread ratios and modulating methods with one normalized data profile in memory (thus providing good flexibility).

These and many other objects have been achieved by using a V-to-I converter followed by a current-controlled oscillator for both the conventional voltage-controlled oscillator (VCO), called closed-loop VCO, and a second VCO, called open-loop VCO, which is separated from the phase-locked loop (PLL). Both VCOs are identical in design thereby reducing circuit parameter variations to an absolute minimum. Both VCOs are driven by the same signal of the PLL. The closed-loop VCO generates a signal $I_X$ which drives the spread spectrum generator while the open-loop VCO receives the modulation current to generate the spread spectrum clock signal. The open-loop ICO is part of the spread spectrum generator and receives feedback current signals representing the modulation method and modulation ratio. This arrangement ensures that the modulated clock output tracks the PLL output frequency and is unique to the present invention. The modulation method and modulation ratio signals are generated by current sources controlled by memories and programmable current dividers providing excellent control over the modulation selection.

In a second embodiment of the present invention the closed-loop VCO receives from the spread spectrum generator the feedback current signal representing the modulation method (center/down spread), while the open-loop VCO receives the feedback current signal representing the modulation ratio. Two identical current sources are used in the second preferred embodiment. This architecture also provides the means to synchronize the two PLL outputs.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a block diagram of the prior art.

FIG. 2 is a block diagram of the prior art.

DESCRIPTION OF THE PREFERRED EMBODIMENT

Figure 3:
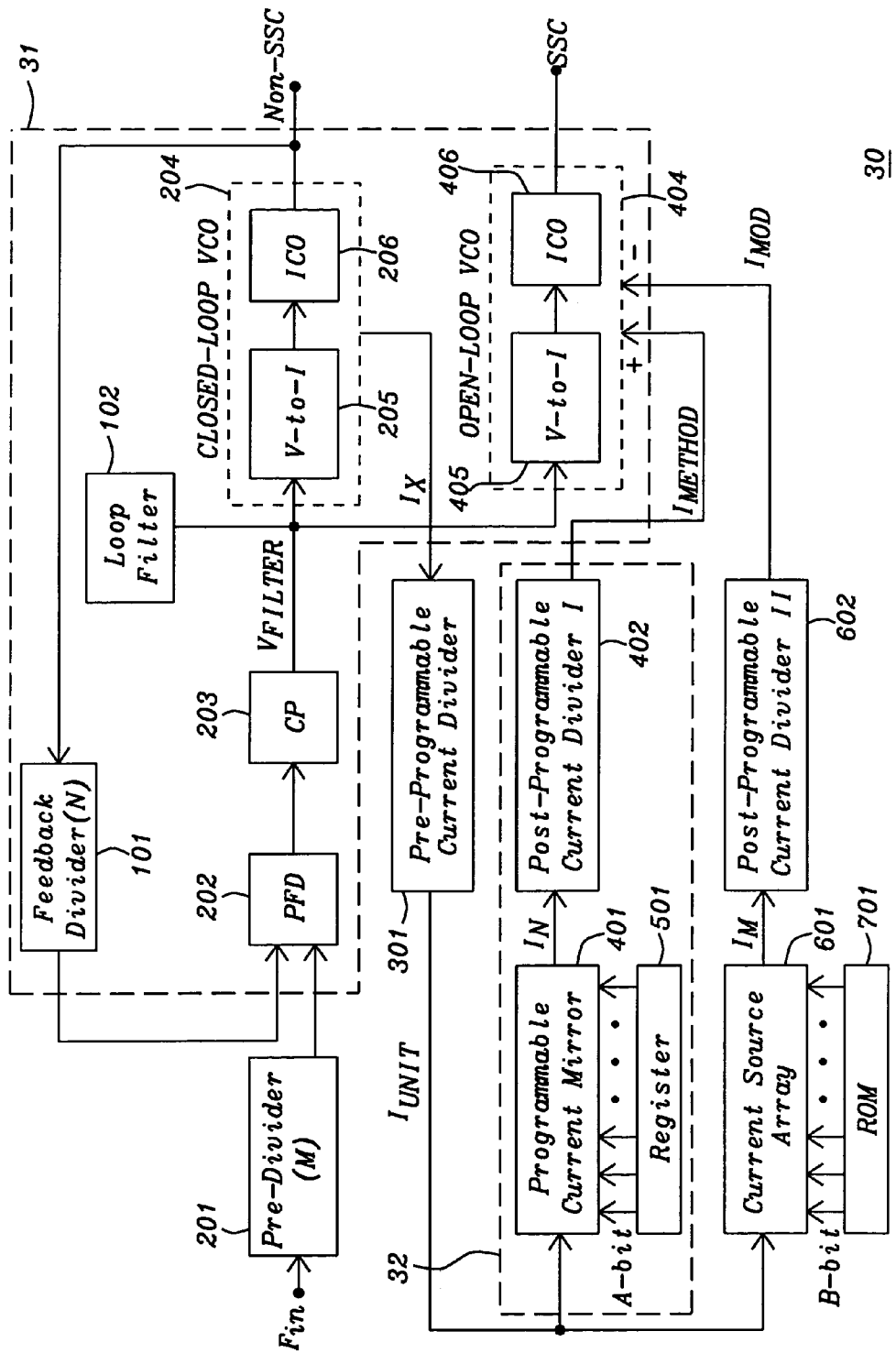
FIG. 3 is a block diagram of the basic principle of the present invention.

Referring now to FIG. 3, we begin a description of the invented Spread Spectrum Clock Generator (SSCG) 30. The SSCG comprises a phase-locked loop (PLL) 31, a Pre-Programmable Current Divider 301, a Current Mirror/Divider 32, a Current Source Array 601 with ROM 701, and a Post-Programmable Current Divider II 602, which will be discussed in more detail below. The PLL receives, via a Pre-divider (M) 201, input signal $F_{IN}$ and comprises the following components, a Phase-Frequency Detector 202, a Charge Pump (CP) 203, a CLOSED-LOOP VCO 204 with V-to-I converter 205 and current-controlled oscillator (ICO) 206, a Feedback Divider (N) 101, a Loop Filter 102, and an OPEN-LOOP VCO 404 with V-to-I converter 405 and ICO 406. The output of ICO 206 provides output signal Non-SSC, and the output of ICO 406 provides output signal SSC. The Current Mirror/Divider 32 comprises Programmable Current Mirror 401, Post-Programmable Current Diver I 402 and Register 501.

Still referring to FIG. 3, the basic principle of the invention is that a Voltage-to-Current (V-to-I) converter 405 modulates the clock signal using not voltage but current. Basically, the invented SSCG consists of four blocks which are: PLL, current mirror/dividers, Current Source Array 601, and memory 701. The PLL has a conventional architecture but what is different is that there are two voltage-controlled oscillators (VCOs) in it. One is a VCO of a conventional PLL which is called CLOSED-LOOP VCO 204, and the other VCO is separate from the conventional PLL and is called OPEN-LOOP VCO 404. Both are exactly identical and driven by the signal $V_{FILTER}$ simultaneously. Not shown in FIG. 3 is that the currents $I_{METHOD}$ and $I_{MOD}$ of the CLOSED-LOOP VCO are set to zero because the CLOSED-LOOP VCO is not modulated (there are no $I_{METHOD}$ and $I_{MOD}$ currents flowing into it). Current $I_X$ of the CLOSED-LOOP VCO feeds Pre-Programmable Current Divider 301, while Current $I_X$ of the OPEN-LOOP VCO is not used.

The CLOSED-LOOP VCO and OPEN-LOOP VCO generate the normal clock and spread spectrum clock, respectively. V-to-I 205 of CLOSED-LOOP VCO generates the reference current ($I_{UNIT}$) for the current source array 601 after the PLL is locked and V-to-I 405 of OPEN-LOOP VCO receives the modulation currents $I_{METHOD}$ and $I_{MOD}$ to modulate the clock signal. $I_{METHOD}$ and $I_{MOD}$ are outputs of Post-Programmable Current Divider I 402 and Post-Programmable Current Divider II 602, to select the modulation method and modulation ratio, respectively.

Output current $I_{UNIT}$ of the Pre-Programmable Current Divider 301 is divided by $2^A$ for $I_N$, and $2^B$ for $I_M$. The Programmable Current Mirror 401 is controlled by Register 501 in which the value (A-bit) is selectable based on the spread method such as center-spread and down-spread and puts out the corresponding current $I_N$. The Current Source Array 601 (B-bit) is controlled by read-only memory (ROM) 701. The ROM contains the modulation profile such as "Hershey Kiss", Step triangular or any other modulation profile and is based on ROM data. The Current Source Array puts out the corresponding current $I_M$.

This ensures that the modulation signal tracks the PLL output frequency; note that this feature is not available in any of the prior art. Then, these currents are passed to Post-Programmable Current Dividers 402, 602 to scale them down to whatever spread methods and spread spectrum ratio is desired (e.g., 1%). The resultant currents are passed to the OPEN-LOOP VCO for current summing or current subtracting with the full scale current that generates the PLL output frequency.

Advantages of the present invention are:
It solves the problem of having to design very precise opamps when doing the voltage sums. Thus, this architecture allows the fine implementation of the "Hershey Kiss", Step triangular or any other modulation profiles.
Other architectures like the one in H. H. Chang, I. Hua, and S. Liu, "*A Spread Spectrum Clock Generator With Triangular Modulation*," IEEE Journal of Solid-State Circuits, Vol. 38, No. 4, April 2003, pp 673–676 can only implement the Step triangular modulation.

This architecture can easily generate a spread spectrum ratio that tracks the VCO output frequency without adding data in memory.

This architecture can easily generate spread methods (down/center spread) without adding data in memory.

I.e., this architecture can easily implement various spread spectrum ratios and modulation methods with one normalized data profile in memory, providing very good flexibility.

A more robust architecture is created since it utilizes voltage-to current converters and current-controlled oscillators which are less susceptible to noise than voltage-controlled oscillators.

Figure 4:
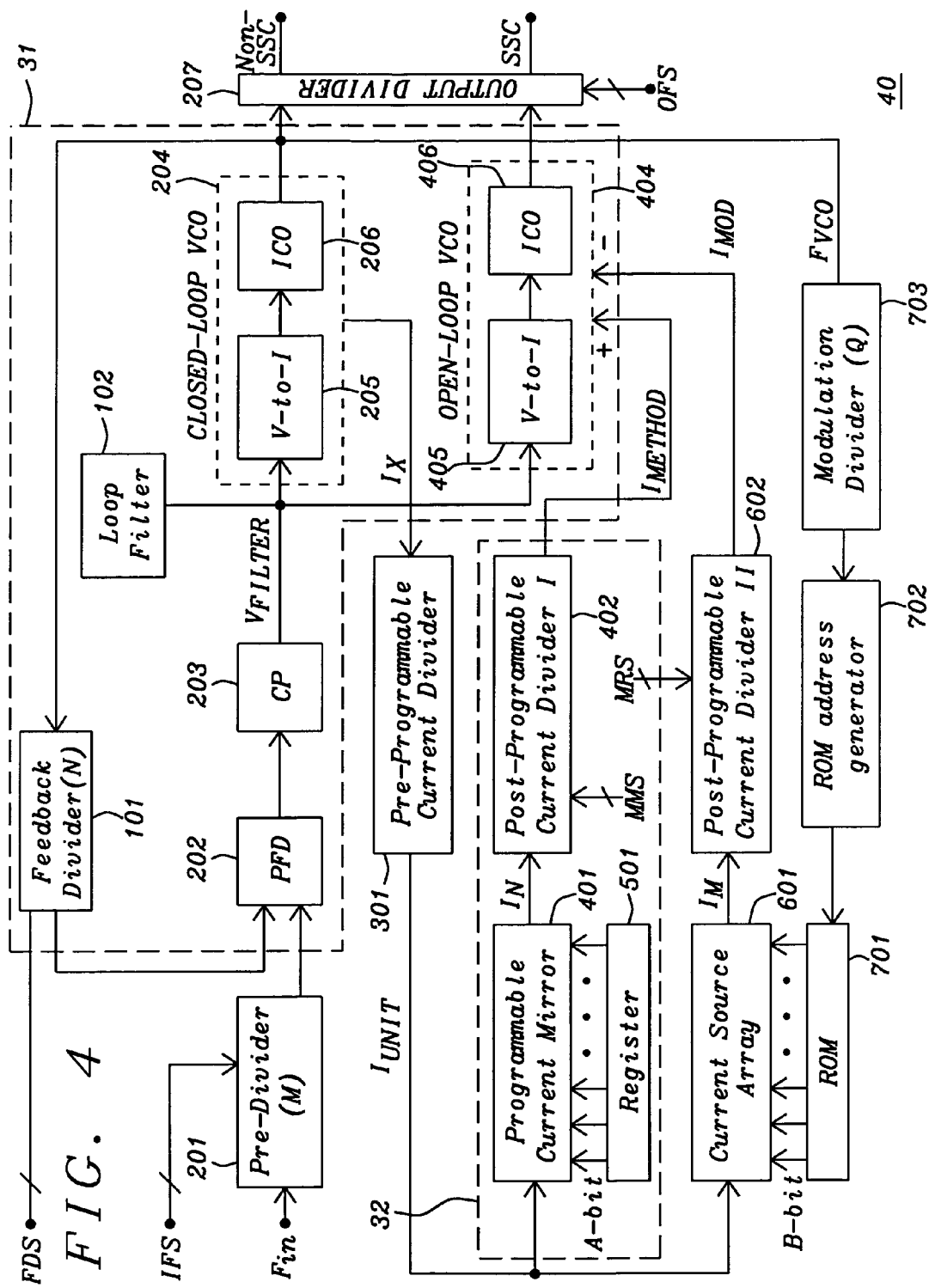
FIG. 4 is a block diagram of a first preferred embodiment of the present invention.

We now direct our attention to FIG. 4 which illustrates the architectural details 40 of the first preferred embodiment of the present invention. All components of FIG. 3 are repeated in FIG. 4. Added are the Output Divider 207, the ROM Address Generator 702, and the Modulation Divider (Q) 703 which receives signal $F_{VCO}$ from ICO 206. Also added are input signals:

Feedback Divider Selection (FDS) to Feedback Divider (N) 101;
Input Frequency Selection (IFS) to Pre-Divider (M) 201;
Output Frequency Selection (OFS) to Output Divider 207;
Modulation Method Selection (MMS) to Post-Programmable Current Divider I 402;
Modulation Ratio Selection (MRS) to Post-Programmable Current Divider II 602.

The preferred implementation for the ICOs 206, 406 is a ring oscillator and for the Current Source Array 601 is a digital-to-analog converter (DAC).

Figure 5:
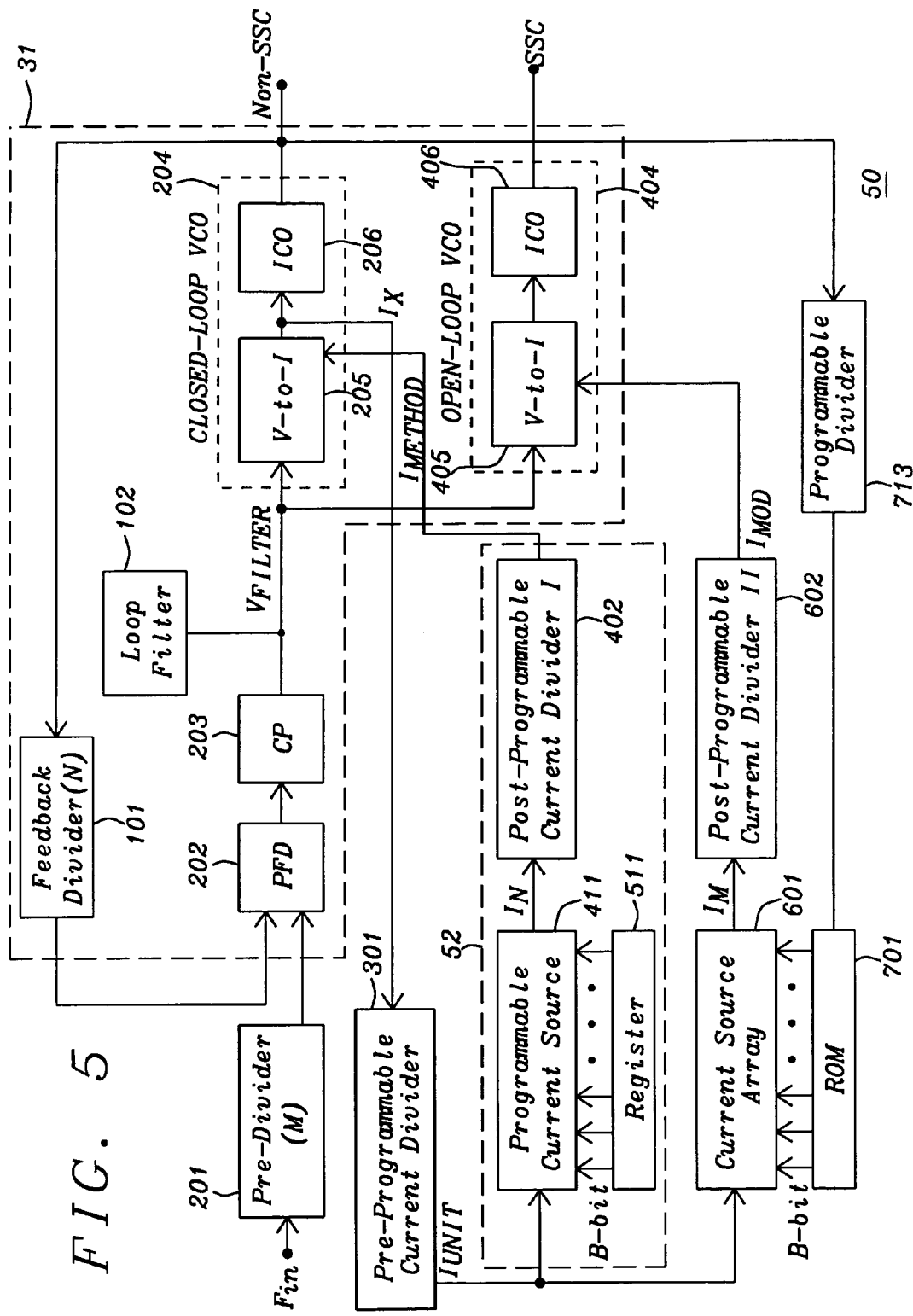
FIG. 5 is a block diagram of a second preferred embodiment of the present invention.

FIG. 5 depicts a second preferred embodiment of the present invention with a somewhat different architecture 50 from that of FIGS. 3 and 4. Following are the components which are different from FIG. 4: Current Source/Divider 52 with Current Source Array 411, Register 511, and Programmable Divider 713. Also different is that a) Post-Programmable Current Divider I 402 feeds back to CLOSED-LOOP VCO 204 thereby establishing a second feedback loop, and b) Post-Programmable Current Divider II 602 drives only OPEN-LOOP VCO 404.

In this second preferred embodiment the output current of V-to-I converter 205 (Non-SSC) is fed to Current Divider 301, which divides this current by $2^B$ as a unit current $I_{UNIT}$ input to the two current source arrays 411 and 601. The first Current Source Array 411 is controlled by Register 511 in which the value is selectable based on the spread method (center- or down-spread). The second Current Source Array 601 is controlled by ROM 701 in which the initial value is set to be equal to the Register 511 value. The ROM contains the modulation profile ("Hershey Kiss", Step triangular or any other modulation profiles) and, based on the ROM data, the second Current Source Array puts out the corresponding current. This ensures that the modulation signal tracks the PLL output frequency (this feature is not available in the prior art referenced above). Then this current is passed to Programmable Divider II 602 to scale it down to the desired spectrum ratio (e.g., 1%). The resultant current ($I_{MOD}$) is passed to the SSC V-to-I converter 405 to effect current summing/current subtracting with the full scale current which generates the PLL output frequency.

Note that both Register 511 and ROM 701 of FIG. 5 in this second preferred embodiment are B-bits wide and that the two Current Source Arrays 411 and 601 are also identical in width. The advantage of having two identical current source arrays and V-to-I converters 205, 405 for ICOs 206, 406, respectively, is that only the register value (and ROM initial value) needs to be changed when changing spread methods from center spread to down spread and vice versa. Besides, selecting the register value to be the center of the B-bit data (digital domain) will ensure that the center spread is very close to 50%. The reason is that since the two current source arrays are identical they will be matched very well in the manufacturing process and the 50% is achieved digitally by the register. Whereas in the first preferred embodiment the center spreading is achieved by offsetting the programmable current mirror to 50% of the full scale of the current source array. Thus, the accuracy of the center spread depends on the matching between the programmable current mirror and the current source array, which is difficult to achieve since they are not identical. Therefore, a further improvement can be made to the first preferred embodiment of the present invention by changing the Programmable Current Mirror 401 of FIG. 4 to be identical with the Current Source Array 601 (i.e., B bits wide). The Post-Programmable Current Divider I 402 will then also be identical with the Post-Programmable Current Divider II 602. Therefore, the accuracy of the center spread depends on the matching of identical blocks. This ensures that center spread will be very close to 50%.

This architecture also provides the means to synchronize the two PLL outputs by calibrating or sensing the two outputs over a modulation period and, accordingly, adjusting the register value to be slightly different from the ROM initial value.

Figure 6:
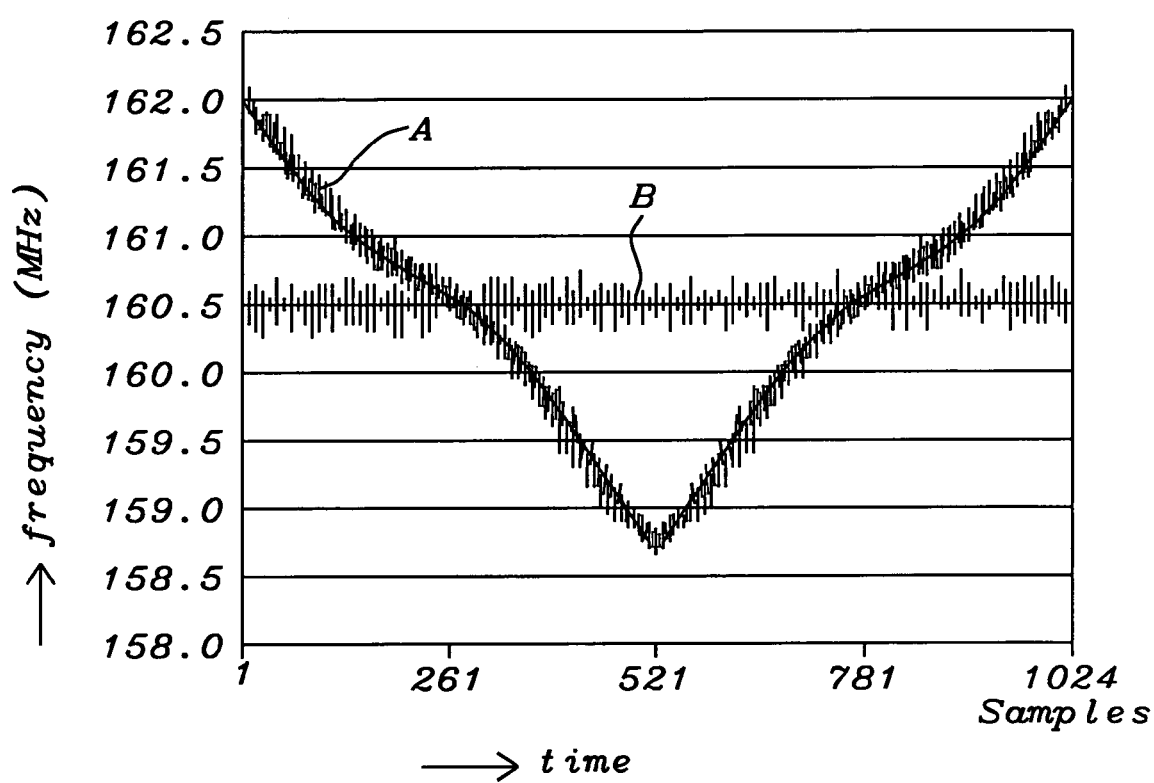
FIG. 6 depicts the modulation profile of the behavioral simulation of the preferred embodiment of the present invention Use of the same reference number in different figures indicates similar or like elements.

FIG. 6 illustrates the results of the behavioral model simulation of the proposed SSCG architecture. Curve A shows the sampled data of the SSC VCO clock and Curve B shows the sampled data of the non-SSC VCO clock. Curve A (SSC) has a modulation frequency of 39 KHz with a spread of −1.0% to +1.0%. Curve B (non-SCC) has a frequency of 160.5 MHz. The x-axis (time) has a total of 1024 samples, where the negative maximum is near sample 521. The crossovers of Curves A and B occurs at about sample 261 and 781. The y-axis (frequency) has a range from 158.0 MHz to 162.5 MHz.

We describe now a method according to the a first preferred embodiment of the present invention which is for generating a clock output signal with reduced amplitude electromagnetic interference harmonics which includes the steps of:

a) generating a series of non-spread spectrum clock pulses in a closed-loop oscillator comprising a first voltage-controlled oscillator with a V-to-I converter in series with a current-controlled oscillator;

b) coupling to the closed-loop oscillator a second voltage-controlled oscillator identical to the first voltage-controlled oscillator; and c) spread spectrum modulating the series of non-spread spectrum clock pulses to flatten and widen the spectrum of the electromagnetic interference harmonics by frequency modulating the second voltage-controlled oscillator utilizing digital memory circuits with stored spread method and modulation ratio data.

In a second preferred embodiment of the present invention step c) is changed to:

c) spread spectrum modulating the series of non-spread spectrum clock pulses to flatten and widen the spectrum of the electromagnetic interference harmonics by frequency modulating the first voltage-controlled oscillator utilizing digital circuits with stored spread method profiles and by frequency modulating the second voltage-controlled oscillator utilizing digital circuits with stored modulation ratio data.

The method for both preferred embodiments further comprises storing center-spread and down-spread profiles in the spread method profile, and storing Hershey-Kiss, Step-Triangular or any other modulation profiles in the modulation ratio profile.

While the invention has been particularly shown and described with reference to the preferred embodiments thereof, it will be understood by those skilled in the art that various changes in form and details may be made without departing from the spirit and scope of the invention.

What is claimed is:

1. An architecture for a spread spectrum clock generator with reduced amplitude electromagnetic interference harmonics, said architecture comprising:

clock pulse generating means including closed-loop voltage-controlled oscillator means for generating a series of clock pulses, said closed-loop voltage-controlled oscillator means further comprising a first V-to-I converter means converting voltage to current, said voltage-controlled oscillator means producing non-spread spectrum voltage-controlled oscillations;

an open-loop voltage-controlled oscillator means coupled to said clock pulse generating means, said open-loop voltage-controlled oscillator means comprising a second V-to-I converter means converting voltage to current, said open-loop oscillator means producing spread spectrum voltage-controlled oscillations with reduced amplitude electromagnetic interference harmonics;

first spread spectrum modulating means coupled to said clock pulse generating means for modulating said open-loop voltage-controlled oscillator means, said first spread spectrum modulating means comprising spread method means for generating a center and down spread selection—for modulating said open-loop voltage-controlled oscillator means, wherein said first spread spectrum modulating means comprises first programmable current mirror means and a first post-programmable current divider means to provide a current to produce said spread method means for said open-loop voltage-controlled oscillator means; and second spread spectrum modulating means coupled to said clock pulse generating means for modulating said open-loop voltage-controlled oscillator means, said second spread spectrum modulating means comprising frequency modulating means for frequency modulating said open-loop voltage-controlled oscillator means, said frequency modulating means comprising profile modulating means for modulating said open-loop voltage-controlled oscillator means and spread spectrum ratio generating means for generating modulation ratios for said open-loop voltage-controlled oscillator means.

2. The architecture of claim 1, wherein said first and said second V-to-I converter means are coupled to a first and a second current-controlled oscillator, respectively.

3. The architecture of claim 1, wherein said closed-loop voltage-controlled oscillator means and said open-loop voltage-controlled oscillator means are identical to each other.

4. The architecture of claim 1, wherein the divisor for said first programmable current mirror means is controlled by a first memory means.

5. The architecture of claim 1, wherein the divisor for said first programmable current mirror means is controlled by a first memory means.

6. The architecture of claim 1, wherein said second spread spectrum modulating means comprises second programmable current mirror means and a second post-programmable current divider means to provide a current to produce said modulation ratio for said open-loop voltage-controlled oscillator means.

7. The architecture of claim 6, wherein the divisor for said second programmable current mirror means is controlled by a second memory means.

8. The architecture of claim 7, wherein said second memory means contains the modulation ratio data comprising data for modulation profiles.

9. An architecture for a spread spectrum clock generator, comprising:
a phase-locked loop means with a closed-loop voltage-controlled oscillator means for locking onto an input signal applied to said phase-locked loop means, said closed-loop voltage-controlled oscillator means comprising a first V-to-I converter means to convert voltage to current and a first current-controlled oscillator means to convert current to frequency, where said closed-loop voltage-controlled oscillator means provides a non-spread spectrum clock output signal;
an open-loop voltage-controlled oscillator means coupled to said phase-locked loop means to provide a spread spectrum clock signal, said open-loop voltage-controlled oscillator means comprising a second V-to-I converter means to convert voltage to current and a second current-controlled oscillator means to convert current to frequency, where said open-loop voltage-controlled oscillator means provides a spread spectrum clock output signal;
a first spread spectrum modulating means in communication with an output of said closed-loop voltage-controlled oscillator means, said first spread spectrum modulating means modulating said open-loop voltage-controlled oscillator means with a selected spread method, where the input current to said first spread spectrum modulating means is divided by a first programmable value, where the output of said first spread spectrum modulating means is coupled to a first input of said open-loop voltage-controlled oscillator means; and
a second spread spectrum modulating means in communication with said output of said closed-loop voltage-controlled oscillator means, said second spread spectrum modulating means modulating said open-loop voltage-controlled oscillator means with a selected modulation ratio, where the input current to said second spread spectrum modulating means is divided by a second programmable value, where the output of said second spread spectrum modulating means is coupled to a second input of said open-loop voltage-controlled oscillator means.

10. The architecture of claim 9, wherein said output of said first spread spectrum modulating means provides a summing current to said open-loop voltage-controlled oscillator means.

11. The architecture of claim 9, wherein said output of said second spread spectrum modulating means provides a subtracting current to said open-loop voltage-control led oscillator means.

12. The architecture of claim 9, wherein said first programmable value is controlled by a first memory means used for storing the spread method data comprising data for center-spread and down-spread profiles.

13. The architecture of claim 9, wherein said second programmable value is controlled by a second memory means used for storing the modulation ratio data comprising data for modulation profiles.

14. An architecture for a spread spectrum clock generator, comprising:
a phase-locked loop means with a closed-loop voltage-controlled oscillator means for locking onto an input signal to said phase-locked loop means, said closed-loop voltage-controlled oscillator means comprising a first V-to-I converter means to convert voltage to current and a first current-controlled oscillator means to convert current to frequency, where said closed-loop voltage-controlled oscillator means provides a non-spread spectrum clock output signal;
an open-loop voltage-controlled oscillator means coupled to said phase-locked loop means to provide a spread spectrum clock output signal, said open-loop voltage-controlled oscillator means comprising a second V-to-I converter means to convert voltage to current and a second current-controlled oscillator means to convert current to frequency, where said open-loop voltage-controlled oscillator means provides a spread spectrum clock output signal;
a first programmable current divider means in communication with the output of said first V-to-I converter means, where said first programmable current divider means divides the input current to said first programmable current divider means by a first value supplied by a first storage means, said first storage means storing a value based on the spread method;
a second programmable current divider means in communication with the output of said first V-to-I converter means, where said first programmable current divider means divides the input current to said second programmable current divider means by a second value supplied by a second storage means, said second storage means storing a value based on the modulation ratio;
a first post-programmable divider means coupled to an output of said first programmable current divider means, where said first post-programmable divider means divides said oscillations of said closed-loop voltage-controlled oscillator means by a first programmable value, where an output of said first post-programmable divider means is coupled to a first input of said open-loop voltage-controlled oscillator means to determine the spread method of the spread spectrum clock output signal; and
a second post-programmable divider means coupled to an output of said second programmable current divider means, where said second post-programmable divider means divides said oscillations of said closed-loop voltage-controlled oscillator means by a second programmable value, where an output of said second post-programmable divider means is coupled to a second input of said open-loop voltage-controlled oscillator means to determine the modulation ratio of the spread spectrum clock output signal.

15. The architecture of claim 14, wherein the input to said first and said second programmable divider means is a divided-down frequency from the output of said first V-to-I converter.

16. The architecture of claim 14, wherein said second storage means comprises a random access memory containing the programmable modulation ratio profile.

17. The architecture of claim 14, wherein said first post-programmable divider stores the spread method data comprising data for center-spread and down-spread profiles.

18. The architecture of claim 14, wherein said second post-programmable divider stores the modulation ratio data comprising data for modulation profiles.

19. An architecture for a spread spectrum clock generator with reduced amplitude electromagnetic interference harmonics, said architecture comprising:
  clock pulse generating means including closed-loop voltage-controlled oscillator means for generating a series of clock pulses, said closed-loop voltage-controlled oscillator means further comprising a first V-to-I converter means converting voltage to current, said voltage-controlled oscillator means producing non-spread spectrum voltage-controlled oscillations;
  an open-loop voltage-controlled oscillator means coupled to said clock pulse generating means, said open-loop voltage-controlled oscillator means comprising a second V-to-I converter means converting voltage to current, said open-loop oscillator means producing spread spectrum voltage-controlled oscillations with reduced amplitude electromagnetic interference harmonics;
  first spread spectrum modulating means coupled to said clock pulse generating means for modulating said closed-loop voltage-controlled oscillator means, said first spread spectrum modulating means comprising spread method means for generating a center spread and down spread selection for modulating said closed-loop voltage-controlled oscillator means, wherein said first spread spectrum modulating means comprises first programmable current source means and a first post-programmable current divider means to provide a current to produce said spread method means for said closed-loop voltage-controlled oscillator means; and
  second spread spectrum modulating means coupled to said clock pulse generating means for modulating said open-loop voltage-controlled oscillator means, said second spread spectrum modulating means comprising frequency modulating means for frequency modulating said open-loop voltage-controlled oscillator means, said frequency modulating means comprising profile modulating means for modulating said open-loop voltage-controlled oscillator means and spread spectrum ratio generating means for generating modulation ratios for said open-loop voltage-controlled oscillator means.

20. The architecture of claim 19, wherein said first and said second V-to-I converter means are coupled to a first and a second current-controlled oscillator, respectively.

21. The architecture of claim 19, wherein said closed-loop voltage-controlled oscillator means and said open-loop voltage-controlled oscillator means are identical to each other.

22. The architecture of claim 19, wherein the divisor for said first programmable current source means is controlled by a first memory means.

23. The architecture of claim 22, wherein said first memory means contains the spread method data comprising data for center-spread and down-spread profiles.

24. The architecture of claim 19, wherein said second spread spectrum modulating means comprises second programmable current source means and a second post-programmable current divider means to provide a current to produce said modulation ratios for said open-loop voltage-controlled oscillator means.

25. The architecture of claim 24, wherein the divisor for said second programmable current source means is controlled by a second memory means.

26. The architecture of claim 25, wherein said second memory means contains the modulation ratio data comprising data for modulation profiles.

27. An architecture for a spread spectrum clock generator, comprising:
  a phase-locked loop means with a closed-loop voltage-controlled oscillator means for locking onto an input signal applied to said phase-locked loop means, said closed-loop voltage-controlled oscillator means comprising a first V-to-I converter means to convert voltage to current and a first current-controlled oscillator means to convert current to frequency, where said closed-loop voltage-controlled oscillator means provides a non-spread spectrum clock output signal; an open-loop voltage-controlled oscillator means coupled to said phase-locked loop means to provide a spread spectrum clock signal, said open-loop voltage-controlled oscillator means comprising a second V-to-I converter means to convert voltage to current and a second current-controlled oscillator means to convert current to frequency, where said open-loop voltage-controlled oscillator means provides a spread spectrum clock output signal;
  a first spread spectrum modulating means in communication with an output of said closed-loop voltage-controlled oscillator means, said first spread spectrum modulating means modulating said closed-loop voltage-controlled oscillator means with a selected spread method, where the input current to said first spread spectrum modulating means is divided by a first programmable value, where the output of said first spread spectrum modulating means is coupled to an input of said closed-loop voltage-controlled oscillator means; and
  a second spread spectrum modulating means in communication with said output of said closed-loop voltage-controlled oscillator means, said second spread spectrum modulating means modulating said open-loop voltage-controlled oscillator means with a selected modulation ratio, where the input current to said second spread spectrum modulating means is divided by a second programmable value, where the output of said second spread spectrum modulating means is coupled to an input of said open-loop voltage-controlled oscillator means.

28. The architecture of claim 27, wherein said first programmable value is controlled by a first memory means used for storing the spread method data comprising data for center-spread and down-spread profiles.

29. The architecture of claim 27, wherein said second programmable value is controlled by a second memory means used for storing the modulation ratio data comprising data for modulation profiles.

30. An architecture for a spread spectrum clock generator, comprising:
  a phase-locked loop means with a closed-loop voltage-controlled oscillator means for locking onto an input signal to said phase-locked loop means, said closed-loop voltage-controlled oscillator means comprising a first V-to-I converter means to convert voltage to current and a first current-controlled oscillator means to convert current to frequency, where said closed-loop voltage-controlled oscillator means provides a non-spread spectrum clock output signal;

an open-loop voltage-controlled oscillator means coupled to said phase-locked loop means to provide a spread spectrum clock output signal, said open-loop voltage-controlled oscillator means comprising a second V-to-I converter means to convert voltage to current and a second current-controlled oscillator means to convert current to frequency, where said open-loop voltage-controlled oscillator means provides a spread spectrum clock output signal;

a first programmable current divider means in communication with the output of said first V-to-I converter means, where said first programmable current divider means divides the input current to said first programmable current divider means by a first value supplied by a first storage means, said first storage means storing a value based on the spread method;

a second programmable current divider means in communication with the output of said first V-to-I converter means, where said first programmable current divider means divides the input current to said second programmable current divider means by a second value supplied by a second storage means, said second storage means storing a value based on the modulation ratio;

a first post-programmable divider means coupled to an output of said first programmable current divider means, where said first post-programmable divider means divides oscillations of said closed-loop voltage-controlled oscillator means by a first programmable value, where an output of said first post-programmable divider means is coupled to an input of said closed-loop voltage-controlled oscillator means to determine the spread method of the spread spectrum clock output signal; and a second post-programmable divider means coupled to an output of said second programmable current divider means, where said second post-programmable divider means divides oscillations of said closed-loop voltage-controlled oscillator means by a second programmable value, where an output of said second post-programmable divider means is coupled to an input of said open-loop voltage-controlled oscillator means to determine the modulation ratio of the spread spectrum clock output signal.

31. The architecture of claim 30, wherein the input to said first and said second programmable divider means is a divided-down frequency from the output of said first V-to-I converter.

32. The architecture of claim 30, wherein said second storage means comprises a random access memory containing the programmable modulation ratio profile.

33. The architecture of claim 30, wherein said first post-programmable divider stores the spread method data comprising data for center-spread and down-spread profiles.

34. The architecture of claim 30, wherein said second post-programmable divider stores the modulation ratio data comprising data for modulation profiles.

35. A method for generating a clock output signal with reduced amplitude electromagnetic interference harmonics comprising the steps of:

a) generating a series of non-spread spectrum clock pulses in a closed-loop oscillator comprising a first voltage-controlled oscillator with a V-to-I converter in series with a current controlled oscillator;

b) coupling to the closed-loop oscillator a second voltage-controlled oscillator identical to the first voltage-controlled oscillator, the second voltage-controlled oscillator generating spread spectrum clock pulses; and c) coupling a spread spectrum generator to an output of the first voltage-controlled oscillator for generating a spread spectrum method signal and a modulation ratio data signal, wherein said spread spectrum generator modulates the series of non-spread spectrum clock pulses to flatten and widen the spectrum of the electromagnetic interference harmonics by frequency modulating the second voltage controlled oscillator with spread method signal and modulation ratio data signal.

36. The method of claim 35, wherein said spread method comprises center-spread and down-spread profiles.

37. The method of claim 35, wherein said modulation ratio data comprises modulation profiles.

38. A method for generating a clock output signal with reduced amplitude electromagnetic interference harmonics comprising the steps of:

a) generating a series of non-spread spectrum clock pulses in a closed-loop oscillator comprising a first voltage-controlled oscillator with a V-to-I converter in series with a current-controlled oscillator;

b) coupling to the closed-loop oscillator a second voltage-controlled oscillator identical to the first voltage-controlled oscillator; and c) spread spectrum modulating the series of non-spread spectrum clock pulses to flatten and widen the spectrum of the electromagnetic interference harmonics by frequency modulating the first voltage-controlled oscillator utilizing digital circuits with stored spread method profiles and by frequency modulating the second voltage-controlled oscillator utilizing digital circuits with stored modulation ratio data.

39. The method of claim 38, wherein said stored spread method profile comprises center-spread and down-spread profiles.

40. The method of claim 38, wherein said stored modulation ratio profile comprises modulation profiles.

* * * * *

UNITED STATES PATENT AND TRADEMARK OFFICE
CERTIFICATE OF CORRECTION

| | |
|---|---|
| PATENT NO. | : 7,161,970 B2 |
| APPLICATION NO. | : 10/939199 |
| DATED | : January 9, 2007 |
| INVENTOR(S) | : Hong Sair Lim and Junho Cho |

Page 1 of 1

It is certified that error appears in the above-identified patent and that said Letters Patent is hereby corrected as shown below:

In the Claims, Column 9, Claim 5, delete "The architecture of claim 1, wherein the divisor for said first programmable current mirror means is controlled by a first memory means." and replace with --The architecture of claim 4, wherein said first memory means contains the spread method data comprising data for center-spread and down-spread profiles.--

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,161,970 B2 |
| APPLICATION NO. | : 10/939199 |
| DATED | : January 9, 2007 |
| INVENTOR(S) | : Hong Sair Lim et al. |

It is certified that error appears in the above-identified patent and that said Letters Patent is hereby corrected as shown below:

In the Claims, Column 9, Claim 5, lines 4-6, delete "The architecture of claim 1, wherein the divisor for said first programmable current mirror means is controlled by a first memory means." and replace with --The architecture of claim 4, wherein said first memory means contains the spread method data comprising data for center-spread and down-spread profiles.--.

This certificate supersedes the Certificate of Correction issued July 8, 2008.

Signed and Sealed this

Twenty-ninth Day of July, 2008

JON W. DUDAS
*Director of the United States Patent and Trademark Office*